(12) United States Patent
Niedrich et al.

(10) Patent No.: US 7,672,590 B2
(45) Date of Patent: Mar. 2, 2010

(54) DATA CENTER WITH MOBILE DATA CABINETS AND METHOD OF MOBILIZING AND CONNECTING DATA PROCESSING DEVICES IN A DATA CENTER USING CONSOLIDATED DATA COMMUNICATIONS AND POWER CONNECTIONS

(75) Inventors: Daniel S. Niedrich, Raleigh, NC (US); David S. Brown, Raleigh, NC (US); Robert S. Minowicz, Jr., Raleigh, NC (US)

(73) Assignee: NetApp, Inc., Sunnyvale, CA (US)

( * ) Notice: Subject to any disclaimer, the term of this patent is extended or adjusted under 35 U.S.C. 154(b) by 1190 days.

(21) Appl. No.: 11/191,765

(22) Filed: Jul. 28, 2005

(65) Prior Publication Data
US 2007/0025271 A1 Feb. 1, 2007

(51) Int. Cl.
*H04B 10/20* (2006.01)
(52) U.S. Cl. ........................................ 398/66
(58) Field of Classification Search .................... 398/66
See application file for complete search history.

(56) References Cited

U.S. PATENT DOCUMENTS

| | | | |
|---|---|---|---|
| 7,209,667 B2 * | 4/2007 | Lindblad | 398/164 |
| 2001/0023669 A1 * | 9/2001 | Buysse | 123/41.55 |
| 2003/0076815 A1 * | 4/2003 | Miller et al. | 370/352 |
| 2006/0099852 A1 * | 5/2006 | Doll et al. | 439/540.1 |
| 2007/0003052 A1 * | 1/2007 | Hein et al. | 379/399.01 |
| 2008/0101590 A1 * | 5/2008 | Zhou | 379/399.01 |

* cited by examiner

*Primary Examiner*—Leslie Pascal
(74) *Attorney, Agent, or Firm*—John R. Ley

(57) ABSTRACT

Data processing devices in a data center are more easily relocated by consolidating the data and power connections to the data processing devices within a mobile data cabinet. The mobile data cabinet includes an access switch to consolidate communications and connections among computing devices in the mobile cabinet and to consolidate communications to a central communication service through a main communication cable. A single data communication connection through the main communication cable and a single electrical power connection through a power delivery cable to the mobile cabinet reduces and simplifies number and difficulty of the disconnections and connections that must be made to move the mobile cabinet.

32 Claims, 4 Drawing Sheets

DATA CENTER WITH MOBILE DATA CABINETS AND METHOD OF MOBILIZING AND CONNECTING DATA PROCESSING DEVICES IN A DATA CENTER USING CONSOLIDATED DATA COMMUNICATIONS AND POWER CONNECTIONS

This invention relates to a data processing center or computer laboratory with multiple distributed data processing devices connected for data communication, and more particularly to a new and improved data center which allows for cost-effective and functionally-effective relocation of data processing devices within the data center without the expense and downtime of individually and specifically disconnecting and reconnecting data communications cables and electrical power distribution cables to each individual data processing devices.

BACKGROUND OF THE INVENTION

Most sizeable business organizations have extensive computer systems for managing large amounts of electronic data. These computer systems typically include a central communication service that is shared by multiple individual data processing devices located in one or more data centers or computing laboratories or which are distributed on a less concentrated bases throughout the business organization. Typically, the data center is either centralized within a building which houses the business organization, or multiple data centers are distributed at different physical locations within the building. Examples of central communication services include, internet protocol (IP) networks, telephony networks, financial services networks, product design services networks, product qualification and test services networks, and marketing services networks, among others. The central communication service is also typically used to link to other communication services outside of the business organization. Examples of data processing devices which may be located in the data center include conventional individual and high-capacity computers or computing devices, computer servers, and data storage servers, among others. These devices may be accessed and controlled by individuals working in the data center itself or over the central communication services by other individuals and computer facilities within the organization. Connection and access to the central communication service by each of the data processing devices in the data center is generally controlled by one or a very few central gatekeeper devices, each of which may be a large port count IP access switch. High capacity data communication cables connect each central gatekeeper with the central communication service to accommodate a high volume of data that may pass through each central gatekeeper. Each data center typically has its own central gatekeeper. The central gatekeeper in each data center also communicates data between the numerous data processing devices within each data center, as well as communicating data to the central communication service. Each data processing device in the data center is therefore individually connected by electrically conducting cables and/or optical cables to the central gatekeeper. Since each data center typically has a relatively large number of individual data processing devices, the central gatekeeper must have a large number of electrical and optical input/output ports and a very high data switching capacity to accommodate all of the data traffic. Large port count gatekeepers are very expensive, on the order of hundreds of thousands of dollars each. To minimize expense, data centers are typically organized to use as few of the central gatekeepers as possible.

Minimizing the number of central gatekeepers in a data center requires that each of the data processing devices be connected to the central gatekeeper by individual electrical or optical cables. The electrical cables are typically high data rate twisted pair copper (TPC) conductors (e.g., TPC Category 15 cable) that are connected with conventional electrical connections to the data processing equipment at one end and to the central gatekeeper at the other end. The optical cables are typically clad optical fibers that are terminated at opposite ends by special techniques which transmit the optical signals through the termination connection with minimum loss of light energy. Optical fibers, which are capable of conducting signals at a high frequency or rate, must be specially and individually terminated to avoid light energy attenuation due to insertion losses and to assure the very high frequency signaling rate. The typical termination usually requires a trained technician with relatively extensive special equipment to accomplish the termination. Each termination costs in the order of a few hundred dollars.

The electrical and optical communication cables physically extend from the central gatekeeper to each of the individual data processing devices in the data center. Because each data center typically includes a large number of data processing devices, there are many hundreds of cables which must be routed physically from each data processing device through the space within the data center to the central gatekeeper. The communication cables are typically routed below a raised floor of the data center or hung by supports from the ceiling within the data center. In any event, there are a considerable number of cables in bundles which physically occupy the space within the data center.

The numerous data processing devices within the data center are usually physically supported in racks which extend from the floor to the ceiling, or within cabinets or enclosures which extend from the floor to near the ceiling. It is not unusual for ten to twenty data processing devices to be included in each rack, cabinet or enclosure. Each rack, cabinet or enclosure thereby forms a support structure for a group of data processing devices. The data processing devices of each support structure are connected to the central gatekeeper through a relatively large bundle of cables which are connected individually at their ends to the data processing devices of the support structure and to the central gatekeeper. The support structures are typically located at fixed positions within the data center. Fixing their position in the data center allows the communication cables to be extended and terminated at the fixed location to service the data processing equipment located in each support structure. A typical data center may have tens or hundreds of the fixed-position support structures. It is apparent that each data center therefore includes many hundreds or thousands of individual communication cables of relatively fixed lengths that are bundled together to accommodate each fixed-position support structure.

In addition to the physical restraints imposed by the bundles of specific length communication cables extending to each support structure, electrical power must be made available at the support structure to power the data processing equipment within that support structure. Because the support structure is fixed in position, the electrical power is typically delivered by electrical conductors confined in conduits to electrical power receptacles located at or close to each fixed support structure. The electrical power receptacles are therefore fixed in position within the data center.

The data processing devices of each support structure must also be cooled to prevent destruction or malfunction due to excessive heat. The traditional data center may have a raised floor which provides space below the support structures to distribute cooling air to the data processing devices of each support structure. Constructing a raised floor in a data center is very expensive because of the special structural supports required for the floor, and because of the airflow devices and ducts required to assure an adequate amount of cooling air to each support structure. As an alternative, ducts may be distributed in the ceiling by which to direct the cooling air on to each support structure and its data processing devices. In either event, the cooling capacity within the data center is fixed by the particular distribution of the cooling air ducts which are located to service the data processing devices of the fixed position support structures.

There often arises a need to redistribute the computational capacity of a data center to accommodate new and different projects or services. In such cases, it is desirable to physically move data processing from one location to another in the data center. This need sometimes arises because special projects require increased computational capacity, or because segments of the business organization grow and need additional computing devices, or because computational capacity needs to be redistributed if cooling limitations exist in the data center, i.e. hot spots. In most cases, it is desirable or required that the data processing devices assigned to a particular project or service be closely located in a physical sense. A close physical relationship will usually facilitate a cooperative and productive use of the computing facilities. In those cases where excess space is available in a support structure assigned to a particular project or service, additional data processing devices can be added to the support structure. However, this circumstance is unusual because the usual approach in data centers is to fully occupy each of the support structures before utilizing another support structure.

The need to move a relatively large number of data processing devices from one location to another in a data center has led to the use of mobile support structures. The mobile support structures are not fixed in position within the data center, but instead typically use casters or rollers to allow them to be rolled between different positions in the data center. The mobile support structures allow their data processing devices to be moved together as a group without removing them from the support structures.

However, mobile support structures do not address the problem of relocating and reconnecting the data processing devices caused by the relatively large bundles of electrical and optical conductors which individually connect the data processing devices to the central gatekeeper. The relatively expensive termination of the optical cables and the large number of electrical cables essentially restrict or tie the data processing equipment in position within the data center, except under the circumstance where new cables are extended and terminated at the new location of the data processing equipment. Extending and terminating the new cables is relatively expensive, which discourages movement of the data processing equipment within the data center. In addition to the cost, considerable downtime when the data processing equipment is not available for use also serves as a restriction on the ability to move the support enclosures and the data processing equipment. The requirements for electrical power may not be readily accommodated without extending new electrical power lines to those locations within the data center where the data processing devices may be relocated. A similar circumstance exists with respect to the cooling capacity. The thermal load created by an accumulation of data processing devices at a particular location in the data center may be so great as to limit the cooling capability in that particular location, and because the cooling capacity was originally antici-pated to be more distributed. The thermal cooling capability also becomes more important as the size of the electronic equipment becomes more miniaturized, because the amount of heat generated in a given volume of space increases.

SUMMARY OF THE INVENTION

The present invention permits quickly and efficiently relocating mobile data cabinets while eliminating the need for large port count centralized gatekeepers and without the physical limitations imposed by the extensive bundles of individual optical and electrical cables. Data communications to and from the mobile cabinets are consolidated among the data processing devices within the data cabinet and externally of the mobile cabinet in a high bandwidth main communication cable that is quickly connected to and disconnected from the mobile cabinet with a multi-use connector that does not require specialized and individualized termination prior to each connection. Electrical power for all the data processing equipment within each mobile cabinet is also consolidated, which permits a single connection to the electrical power which is distributed throughout the data center at the locations where the mobile cabinets may be positioned, thereby avoiding any necessity to specially extend electrical power service to the new location. Cooling the data processing equipment within the mobile cabinet is easily accomplished by adjusting positions of the mobile cabinets in the data center to accommodate localized limitations in cooling, or if the cooling capacity is not limited, then to adjust and/or optimize cooling at the locations where the data processing equipment is repositioned.

These and other improvements and advantages are achieved by a method of mobilizing multiple data processing devices within a data center where the multiple data processing devices are connected to a shared central interface by which to communicate with each other and with a central communication service. The data processing devices are divided into multiple groups, with each group having multiple data processing devices. The group of data processing devices is located in a separate mobile cabinet. An access switch and a multiplicity of computing devices are included in each mobile cabinet. The computing devices in each mobile cabinet are connected to the access switch. The access switch of each mobile cabinet is connected to the shared central interface with a main communication cable by mating two complementary connectors, one of which is attached to the access switch and the other of which is attached to the main communication cable. Data is communicated between data processing devices in each mobile cabinet through the access switch. Data is communicated between the shared central interface and the data processing devices in each mobile cabinet through the main communication cable. To relocate the data cabinet, the complementary connector of one main communication cable is disconnected from the complementary connector of the access switch, the mobile cabinet is moved from an initial location within the data center to a subsequent location which is physically displaced from the initial location, and the complementary connector of the access switch is reconnected with a substantially identical complementary connector of another main communication cable extending from the shared central interface to the subsequent location.

Other improvements and advantages of the invention are achieved with a mobile data cabinet for use in repositioning multiple data processing devices within a data center where the multiple data processing devices are connected to a shared central interface by which to communicate with each other and with a central communication service. The data center includes a plurality of main communication cables connected to the shared central interface and extending therefrom to multiple locations within the data center. The mobile data cabinet comprises a cabinet for supporting a group of data processing devices within the cabinet. The group is a plurality of data processing devices which includes one access switch and a plurality of computing devices. The access switch is connected to the computing devices within the cabinet to communicate data between the computing devices. Two complementary connectors one of which is attached to the access switch and the other of which is attached to a main communication cable within the data center, are connected to permit data communication between the access switch and the shared central interface. Rollers are included on the cabinet to move the cabinet within the data center from an initial location to a subsequent location which is physically displaced from the initial location. The two complementary connectors permit moving the cabinet from the initial location to the subsequent location by disconnecting the complementary connector attached to the main communication cable from the complementary connector attached to the access switch at the initial location and thereafter reconnecting the complementary connector attached to a different main communication cable to the complementary connector attached to the access switch at the subsequent location.

Supplemental features involve some or all of the following. Each main communication cable takes the form of a main optical cable, and an optical interface is included as part of the data processing equipment in each mobile cabinet. The main optical cable is connected to the access switch through the optical interface. The main optical cable is connected to the optical interface by mating two complementary optical connectors one of which is attached to the optical interface and the other of which is attached to the main optical cable. Data is communicated between the shared central interface and the data processing devices in each mobile cabinet through the main optical cable and the optical interface. Moving the mobile cabinet from the initial location to the subsequent location is achieved by disconnecting the complementary optical connector of one main optical cable from the complementary optical connector of the optical interface at the initial location and reconnecting the complementary optical connector of the optical interface with a substantially identical complementary optical connector of another main optical cable at the subsequent location.

Additional supplemental features include the following. The complementary optical connectors on the ends of the main optical cables universally connect to the complementary optical connector of the optical interface in a manner which does not require individual termination when connecting the end of the main optical cable to the optical interface. The complementary optical connectors may be multi-path push-on type optical connectors. The complementary optical connectors limit an insertion loss at each connection to no greater than 0.5 dB. The computing devices within the mobile cabinet are electrically connected to the access switch, and the access switch is optically connected to the optical interface. A terminal server, also known as a console server which is a form of an out of band management system, may be included as part of the data processing equipment in the mobile data cabinet, and the terminal server is electrically connected to the access switch. One of the computing devices within the mobile data cabinet may be optically connected to the optical interface to communicate data optically between the optical interface and that computing device.

A more complete appreciation of the scope of the present invention and the manner in which it achieves the above-noted and other improvements can be obtained by reference to the following detailed description of presently preferred embodiments taken in connection with the accompanying drawings, which are briefly summarized below, and by reference to the appended claims.

DETAILED DESCRIPTION

Figure 1:
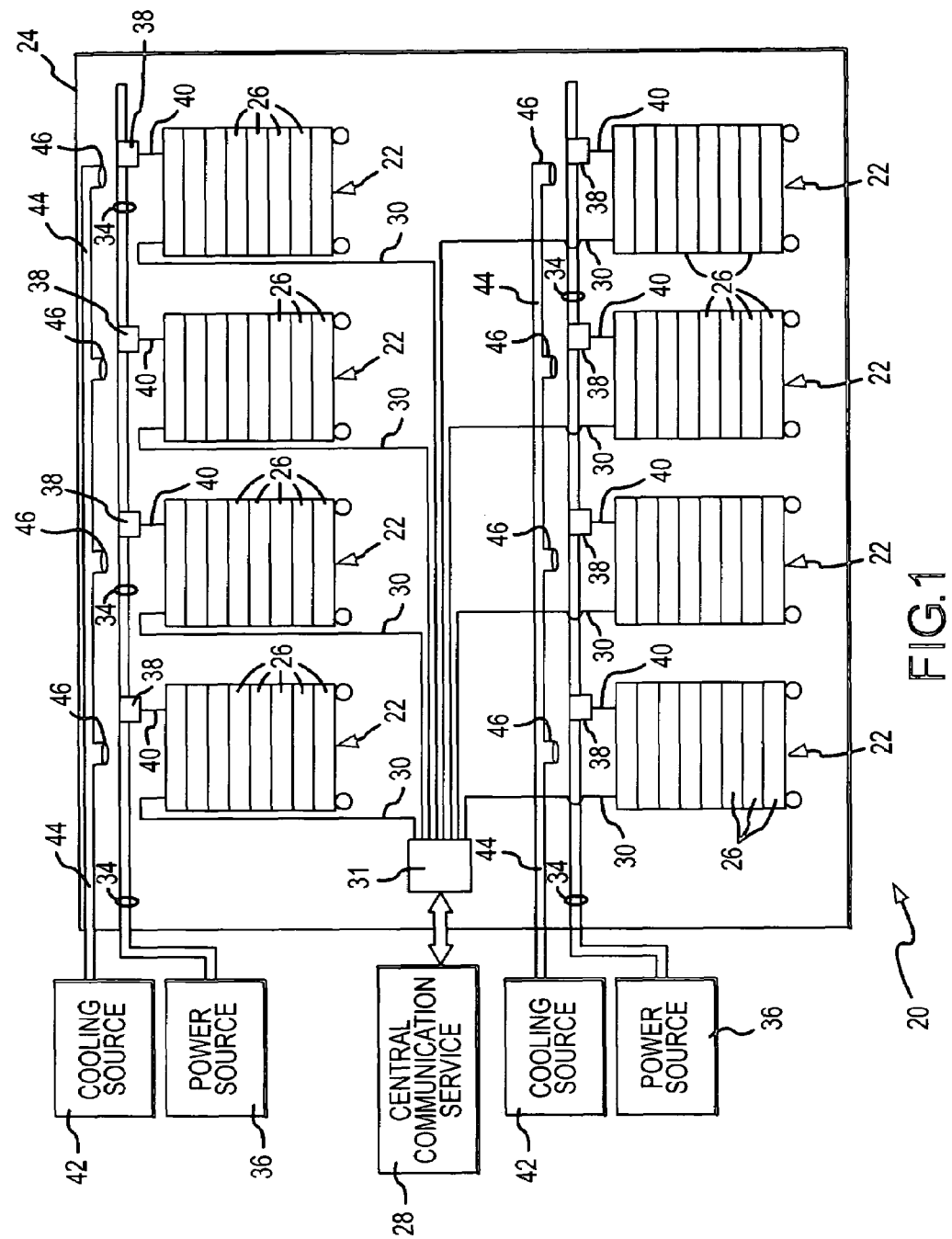
FIG. 1 is a block and schematic illustration of multiple mobile data cabinets in a data center, in accordance with the present invention.

A computing laboratory or data center 20 which utilizes modular data cabinets 22 to form the present invention is shown in FIG. 1. The data center 20 is typically a room 24 within a larger building structure (not shown), or possibly may be a building structure entirely of its own, within which there is located a relatively large amount or aggregation of conventional data processing devices 26. In the present invention, the data processing devices 26 are located in the modular cabinets 22. The data processing devices 26 provide the computational and communication data processing services required for a particular application, or for multiple applications. For example, the data processing devices 26 may provide the data processing services for research and development, for marketing, for financial services, for information storage, and the like.

Information is transferred to and from as well as within the data center 20 through a central communication service 28. The central communication service 28 is shared by the multiple individual data processing devices 26 in the data center 20. Examples of typical central communication services include internet protocol (IP) networks, telephony networks, financial services networks, product design services networks, product qualification and test services networks, and marketing services networks, among others. It is through the central communication service 28 that the data is communicated from the data center 20 to locations and data processing devices outside of the data center.

Data is communicated from each mobile cabinet 22 over a high bandwidth main communication cable 30. All data communication to and from the data processing devices 26 in each cabinet 22 advantageously occurs over the single main communication cable 30, which may be an optical cable or a conductor-type cable. Each main communication cable 30 is connected at one end to a shared central interface 31 and at the other end to a high bandwidth interface and connection device 32, shown in FIGS. 2 and 3. The shared central interface 31 and the interface and connection device 32 are optical devices if the main communication cable is an optical cable or are electrical signal responsive devices if the main communication cable is an electrical conductor. Data is communicated from each cabinet 22 over the main communication cable 30 to the shared central interface 31 and from the shared central interface 31 to other data processing equipment accessed over the central communication service 28. Similarly, the shared central interface 31 routes incoming signals from the central communication service 28 to the data processing devices 26 within the mobile cabinets 22. Further still, the shared central interface 31 routes signals on the main communication cables 30 among the different mobile cabinets 22 within the data center 20.

The main communication cable 30 has at least one and up to twelve or more separate optical fibers or multiple electrical conductors by which to transfer a relatively high bandwidth of data. Each optical cable 30 may advantageously take the form of a 10 gigabit (Gb), 50 micron-multi-mode, enhanced, 12-strand, modular cable. The relatively few number of optical fibers in the cable 30, and its relatively high bandwidth for transferring data, eliminates the need for individual twisted pair copper (TPC) wire conductors to be connected individually between each data processing device and a centralized access switch (not shown) which interfaces with the central communication service, as is the typical conductivity infrastructure in prior art data centers, insofar as is presently known. The high bandwidth optical cable 30 is relatively small and easily manipulated in comparison to the massive number of bundled twisted pair copper (TPC) conductors which would be required to carry the same amount of data. For example, a bundle of TPC conductors having a diameter of a few inches might be required to carry all the data which can be carried by the main high bandwidth optical cable 30.

Because of the substantially reduced size of each high bandwidth optical cable 30, it may be easily connected to and disconnected from the optical interface and connection device 32 of each mobile data cabinet 22, thereby allowing the cabinets 22 to be easily moved from one position to another position within the data center 20 without incurring the physical restraints of having to move and size the large numbers of bundled TPC connectors. Moreover, as is discussed in greater detail below, each of the main optical cables 30 may be readily connected to and disconnected from each of the mobile cabinets 22 without requiring individual and specific terminations and consequently without incurring the substantial costs for making the individual and specific terminations.

Electrical power is distributed throughout the data center 20 by an electrical buss 34 which is connected to an electrical power source 36. Electrical power source 36 is conventional commercially-available electrical power. The electrical buss 34 includes one or more electrical conductors which carry the electrical power, and a ground or reference conductor which supplies reference potential at the buss 34. A quick connect power connection module 38 is attached to the electrical buss 34 at selected and advantageous locations within the data center 20, by which to supply electrical power to each mobile cabinet 22.

A single electrical power delivery cable 40 extends between each mobile cabinet 22 and the connection module 38 connected to the electrical buss 34. The electrical power delivered to each mobile cabinet 22 by the power delivery cable 40 is delivered within the cabinet 22 to the data processing devices 26 within that cabinet. The use of only a single power delivery cable 40 for each mobile cabinet 22 also facilitates relatively easy movement of the cabinets 22 within the data center 20, because only the single power delivery cable 40 needs to be extended to the electrical buss 34 and the electrical buss 34 is distributed generally throughout the entire data center 20. The connection modules 38 may be easily repositioned along the electrical buss 34 to assure that electrical power for each of the mobile cabinets 22 is closely available at any location where each mobile cabinet 22 may be located within the data center 20.

A substantial amount of thermal heat is generated by operating the data processing devices 26 within each cabinet 22. If the heat is not removed, the data processing devices 26 will be damaged or become inoperable. The data center 20 therefore includes a cooling source 42 from which cooling fluid, typically air, is distributed through cooling ducts 44 and outlets 46 around each of the cabinets 22 and its data processing devices 26. The cooling fluid cools the data processing devices 26 and assures their continued reliable operation. In general, the cooling ducts 44 and the outlets 46 are generally uniformly distributed throughout the data center 20, so as to accommodate cooling requirements at different locations within the data center due to the placement of the mobile cabinets 22. Also, dampers and other types of fluid control gates (not shown) may be included in the cooling ducts 44 and outlets 46 in order to regulate the flow of cooling fluid to those areas of the data center 20 according to the thermal load within those areas. A relatively fewer number of mobile cabinets 22 in one area of the data center 20 will create a reduced requirement for thermal cooling capacity while an increased cooling capacity will be required in other areas where a relatively larger number of data processing devices are located. In this manner, the thermal cooling capacity within the data center may be adjusted according to the position and location of the mobile cabinets 22.

Figure 2:
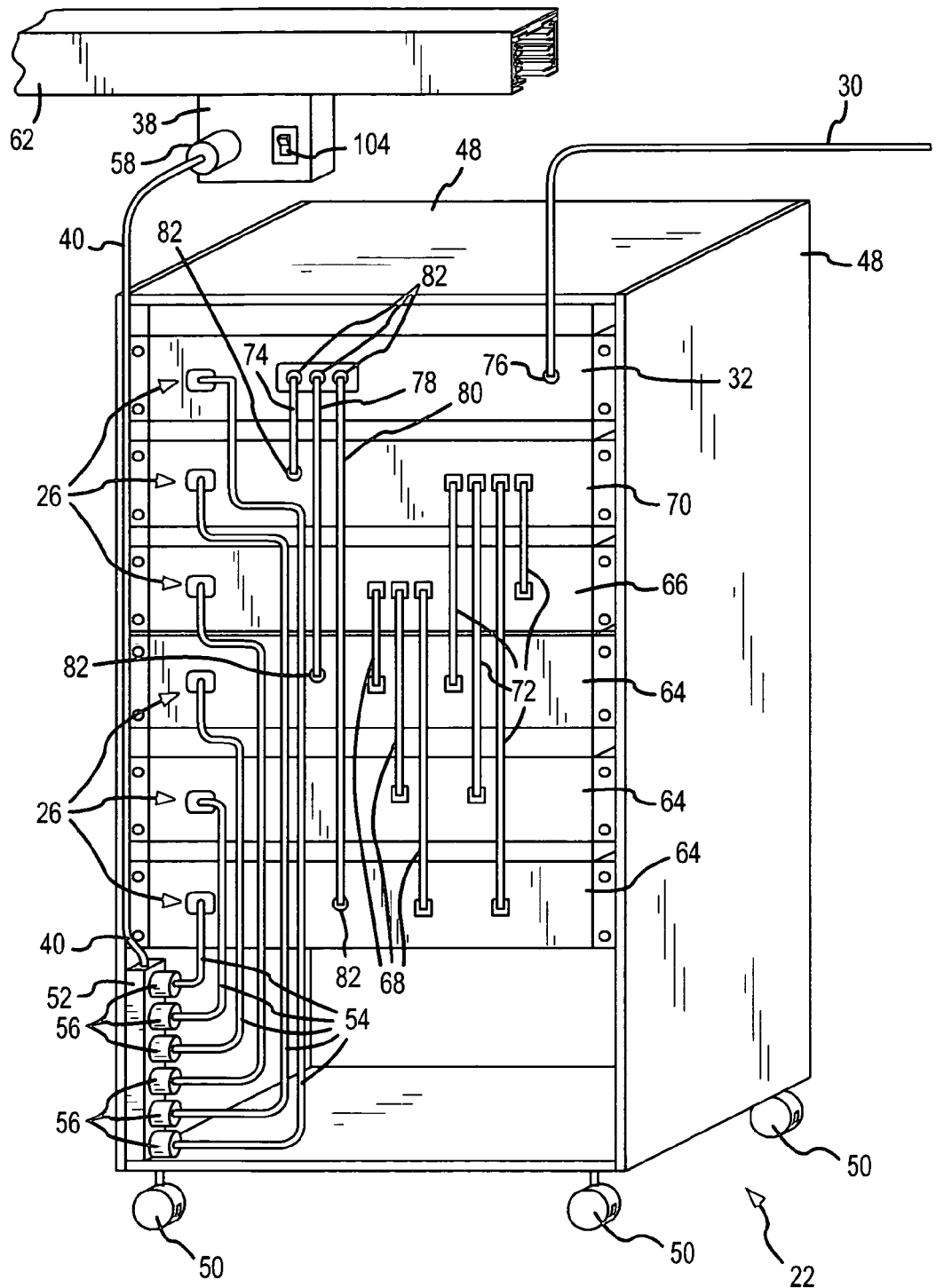
FIG. 2 is a perspective view of one mobile data cabinet of the type shown schematically in FIG. 1.
Figure 3:
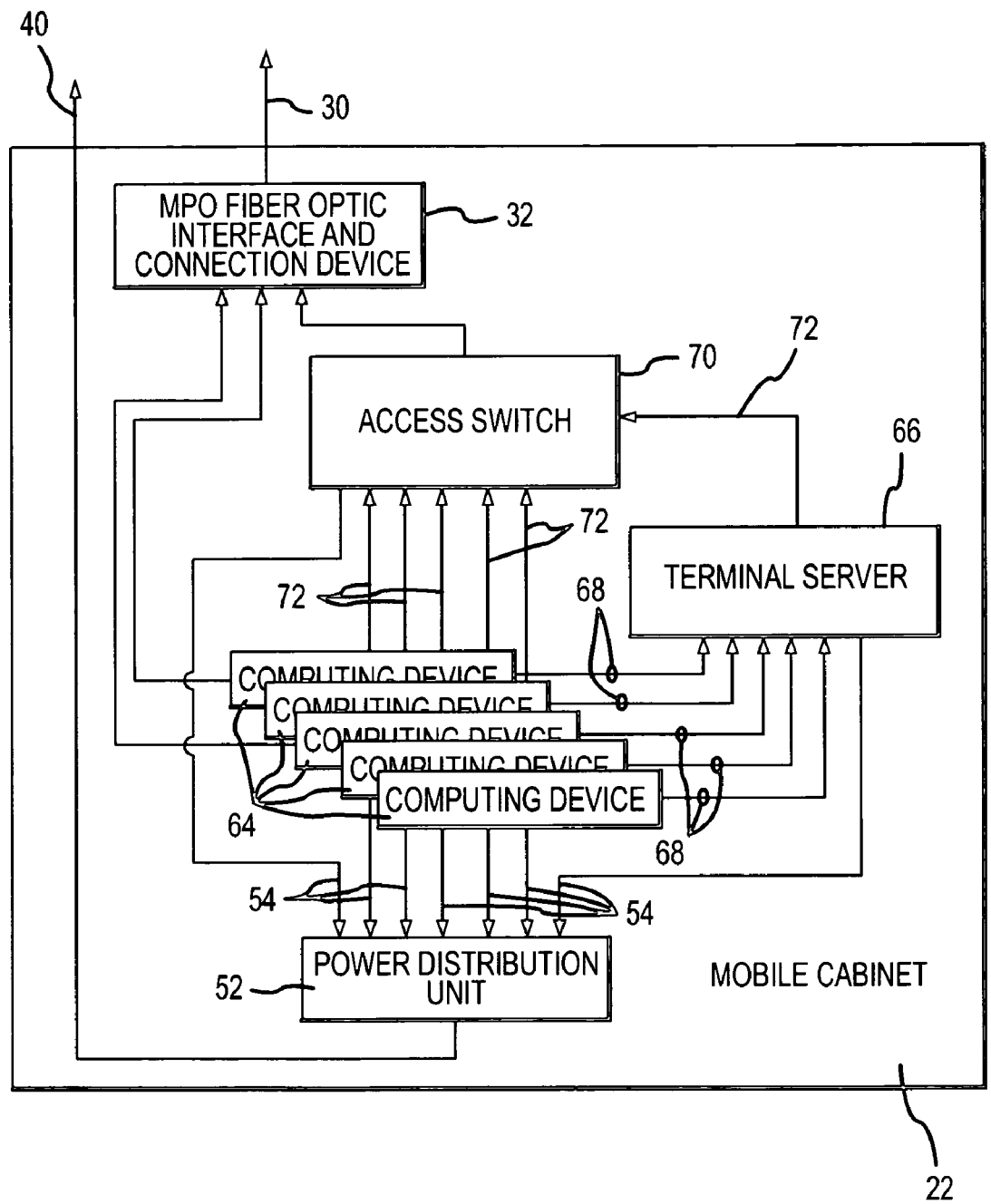
FIG. 3 is a block diagram illustrating the electrical and mechanical components and connections of the mobile data cabinet shown in FIG. 3.

More details of the mobile data cabinet 22 are shown in FIGS. 2 and 3. Each mobile data cabinet 22 includes an enclosure or housing structure 48 to which rollers or casters 50 are attached. The housing structure 48 includes racks or other mechanical support components (not specifically shown) which physically support the data processing devices 26 within the housing structure 48. The casters 50 allow the cabinet 22 to be moved around the data center 20. The housing structure 48 is formed with side and end walls, although some of the side walls may be removable to provide access for electrically inserting, removing, connecting and controlling the data processing devices 26 located within the housing structure 48.

A power distribution unit 52 is also located within the housing structure 48. The power distribution unit 52 includes a plurality of conventional electrical plug-in receptacles (not specifically shown). Electrical power cords 54 extend from each of the data processing devices 26 within the housing structure 48, and electrical plugs 56 on the ends of each of the power cords 54 are connected to the plug-in receptacles of the power distribution unit 52. One end of the power delivery cable 40 is connected to the plug-in receptacles of power distribution unit 52, and an electrical plug 58 at the other end of the electrical connection cable 48 is connected to the connection module 38. The connection module 38 is selectively and moveably connected to the electrical buss 34, which is enclosed within a protective enclosure 62. Electrical power from the electrical buss 34 flows through the power delivery cable 40 to the power distribution unit 52 and from the power distribution unit through the power cords 54 to power the data processing devices 26. Although not shown, power filtering and conditioning, surge protection and battery backup capabilities may also be provided in each mobile data cabinet 22.

A substantial number of the data processing devices 26 in the cabinet 22 are computing devices 64. The computing devices 64 perform the processing, computational and some of the storage functions particular to the specific type of data processing functionality desired from each device 26, the cabinet 22 and/or the data center 20. Each computing device 64 will usually take the form of a conventional computer.

Usually, there are a multiplicity of the computing devices 64 in each cabinet 22, for example up to ten to fifteen, although a lesser number is shown in FIGS. 2 and 3.

Another one of the data processing devices 26 in the cabinet 22 is a terminal server 66. The terminal server 66 performs the typical out of band management functionality for the computing devices 64 within the mobile cabinet 22. The computing devices 64 are directly connected to the terminal server 66 through individual conductors 68. The conductors 68 are connected between the typical serial input/output ports of the computing devices 64 and the terminal server 66. Signals can be communicated directly between the terminal server 66 and each of the computing devices 64 over the electrical conductors 68. In a typical mobile data cabinet 22, the conductors 68 are electrically conductive wires, although optical cables could also be used as the conductors 68.

An access switch 70 also forms one of the data processing devices 26 within the mobile cabinet 22. The access switch 70 routes data between the data processing devices 26 of each cabinet 22 within the data center 20. The most desirable form of the access switch 70 is a low cost, relatively low port count, 1 Gb Ethernet TPC layer two access switch. The computing devices 64 and the terminal server 66 are connected to the access switch 70 with electrical conductors 72. The electrical conductors 72 form a signal communication media for a small local area network which links the computing devices 64 and the terminal server 66 within the mobile data cabinet 22. The electrical conductors 72 connect to network interfaces (not shown) in the access switch 70, the terminal server 66 and the computing devices 64, by which to implement the local area network functionality for routing signals 36 between the computing devices 64, the terminal server 66 and the access switch 70.

The access switch 70 also converts certain electrical signals carried by the conductors 72 into optical signals, and supplies those optical signals on an optical cable 74 to the optical interface and connection device 32. Those electrical signals which are converted into optical signals by the access switch 70 and supplied to the optical interface and connection device 32 on the optical cable 74 are ones which are destined to be transmitted from the mobile data cabinet 22 over the main optical cable 30. Similarly, the access switch 70 converts optical signals received on the main optical cable 30 into electrical signals, and delivers those electrical signals on the conductors 72 to the computing devices 64 and the terminal server 68. The access switch 70 thereby controls access between the data processing devices 26 within the mobile data cabinet 22 and controls access between the data processing devices 26 within each mobile data cabinet 22 and the central communication service 28.

The access switch 70 has a much lower port count and a slightly slower switching speed than the centralized access switch which is typically used to connect all of the data processing equipment within a prior art data center. Therefore, the cost of the access switch 70 is considerably lower than the cost of the centralized access switch and is low enough to allow the access switch 70 to be included on an economic basis in each mobile cabinet 22. The major benefit of using the access switch 70 in the mobile data cabinet 22 is that it allows the data processing devices 26 in the cabinet 22 to be connected in a consolidated manner with the main high bandwidth optical cable 30, rather than requiring all of the data processing devices 26 within the mobile data cabinet 22 to be connected to the shared central interface 31 with a multiplicity of individual electrical conductors extending from each cabinet 22. Such bundles of individual electrical conductors limit the mobility and positioning of the data processing equipment within the data center, due to the mass numbers and bulkiness of those cables and the considerable expense of extending and connecting new conductors whenever some or all of the data processing equipment within the data center must be moved. The data signals from many data processing devices 26 within each mobile data cabinet 22 can thereby be consolidated and directed over the single main high bandwidth optical cable 30.

The use of the access switch 70 also keeps all of the electrical conductors of relatively short length and located within the housing structure 48 of each mobile data cabinet 22. The electrical connectors between the data processing devices 26 do not have to be disconnected and re-connected every time that the data processing devices need to be moved within the data center 20. Instead, the data processing devices 26 are moved with the mobile data cabinet 22 while leaving intact all of the internal connections of the data processing devices 26 within the cabinet 22.

The interface and connection device 32 is a conventional optical switch for routing optical signals to and from the mobile data cabinet 22 over the main optical cable 30. The main optical cable 30 is connected to the optical interface and connection device 32 with a multi-path push-on (MPO) connector 76, or another advantageous type of quick-connect and quick-disconnect connector, which connects to an input/output optical port of the device 32. The MPO connector 76 pre-terminates each of the twelve fibers of the main cable 30 to provide no greater than a 0.5 dB insertion loss per fiber. The twelve fibers of the main cable 30 create six duplex LC connections capable of transmitting optical signals at a 10 Gb rate. The optical device 32 also has a capability of routing and switching optical signals at the 10 Gb rate.

The optical interface and connection device 32 also consolidates all of the optical cable connections within the mobile data cabinet 22. Optical signals are communicated between an optical input/output port of the access switch 70 and the optical device 32 over the optical cable 74. Two other optical cables 78 and 80 are illustrated exemplarily as connected between the optical interface and connection device 32 and two of the computing devices 64. The optical cables 78 and 80 communicate optical signals generated directly by those types of computing devices 64, under circumstances where the computing devices 64 have the capability of transmitting and receiving optical signals.

For those computing devices 64 and other data processing devices 26 which have no capability for directly transmitting optical signals, electrical signals conducted by the electrical conductors 72 between those devices and the access switch 70 are converted by the access switch 70 into optical signals that are then communicated through the optical cable 74 to the optical device 32. A similar effect occurs for optical signals destined to computing devices 64 and other data processing devices 26 which have no capability for directly receiving optical signals. In that case, the access switch 70 converts the optical signals received on the optical cable 82 into electrical signals and supplies those electrical signals through the conductors 72 to the computing devices 64 and other data processing devices 26.

The optical cables 74, 78 and 80 are also advantageously pre-terminated at each end with MPO connectors 82, or other quick-connect and quick-disconnect connectors. The MPO connectors 82 provide no greater than a 0.5 dB insertion loss. The MPO connectors 76 and 82 allow the optical cables 30, 74, 78 and 80 to be connected to and disconnected from the data processing devices 26 without the necessity to specially and individually terminate each optical cable using specialized tools and highly trained personnel. Consequently, the complement of data processing devices 26 included within the mobile data cabinet 22 can easily be changed. Moreover, the ability to disconnect the main optical cable 30 from each mobile data cabinet 22 and thereafter reposition and reconnect the mobile cabinet 22 to another main optical cable 30 in a different location within the data center 20 also greatly facilitates the best advantageous positioning and use of the data processing devices 26 within the data center 20. The cost of making an optical connection is therefore greatly reduced.

Because the MPO connectors 76 and 80 provide no greater than a 0.5 dB insertion loss, the optical standard of no greater than 2.6 dB of optical energy loss, also called channel insertion loss, is assured for the entire transmission medium end to end as defined by IEEE 802.3ae 10 Gig Task Force for multimode fiber at 850 nano-meter wavelength in a typical fully interconnected patch scheme of four MPO connectors. Optical signaling at the 10 Gb rate within the data center 20 is thereby assured. No more than four optical connections exist between any data processing devices 26 and the central service interface 31, as is appreciated from FIGS. 1 and 2. The optical cables 30, 74, 78 and 80 do not accumulate in total more than the 0.6 dB loss, thereby assuring compliance with the optical standard within the data center 20.

The mobile data cabinet 22 described above may be used in conjunction with one or two additional mobile housing structures 48 enclosures (FIG. 2) which house and support only computing devices 64 and terminal servers 66. Such additional mobile housing structures 48 do not include access switches 70 or optical interface and connection devices 32. Instead, the data processing devices of the additional mobile housing structures 48 are connected by optical cables and by electrical conductors to the mobile data cabinet 22 that does include the access switch 70 and the optical device 32, thereby causing the access switch 70 and the optical device 32 of that mobile cabinet 22 to switch and route the optical and electrical signals among all of the computing devices 64 and the terminal servers 66 included in the mobile data cabinet 22 and in the associated mobile housing structures 48. This arrangement may prove efficient under those circumstances where one access switch 70 and one optical device 32 is capable of handling a greater amount of data traffic than can be generated by the computing devices 64 and terminal servers 66 of the mobile data cabinet 22 by itself. Utilizing one or two mobile housing structures 48 with the single mobile data cabinet 22 does not limit the mobility of the data processing devices within the associated mobile housing structures 48, because the connections to and from the data processing devices in both the mobile data cabinet 22 and the mobile housing structures 48 has the same characteristics as have been described above in conjunction with the mobile data cabinet 22.

Figure 4:
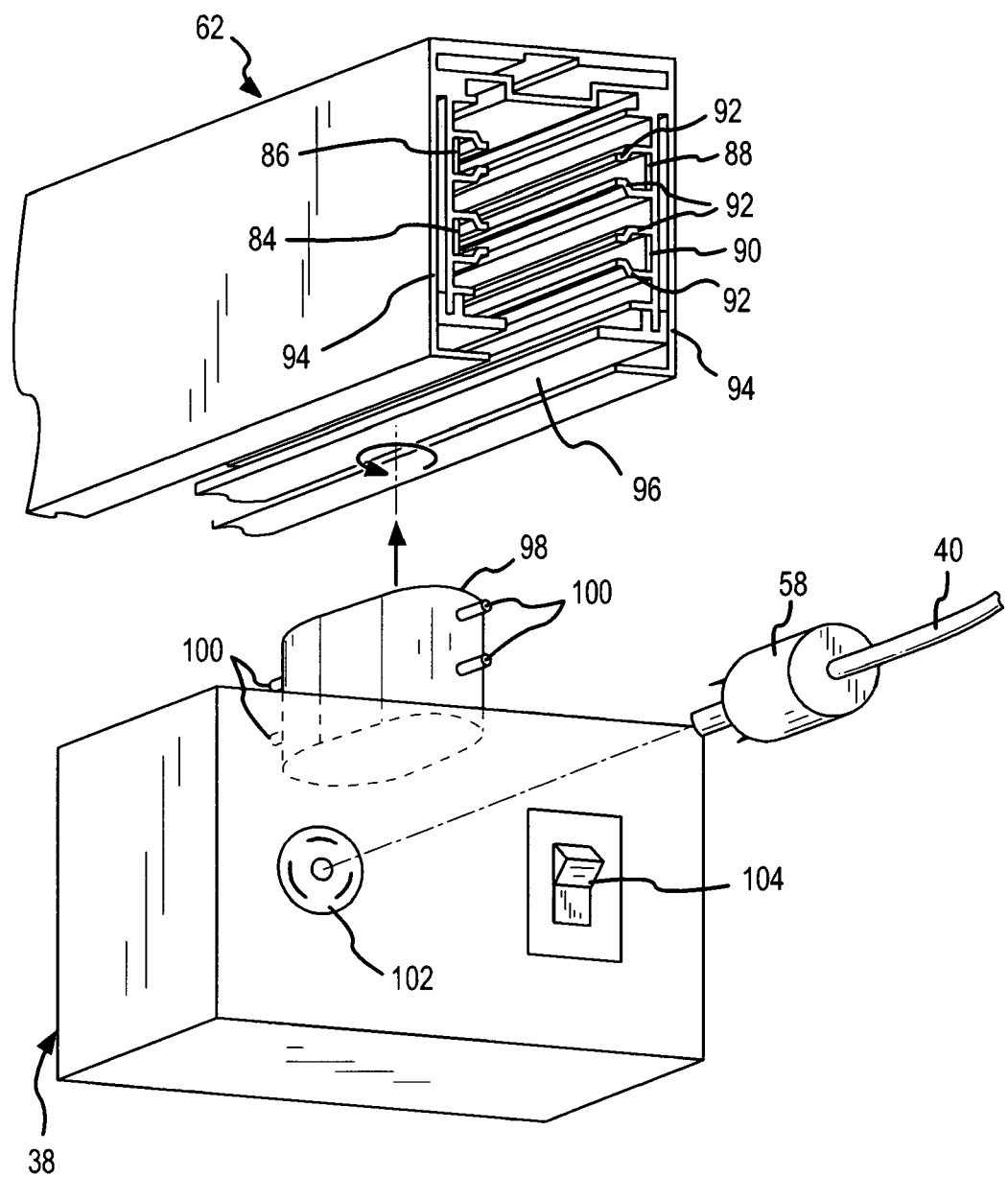
FIG. 4 is an exploded partial perspective view of electrical power distribution components shown schematically in FIG. 1 and in a less detailed form in FIG. 2.

Details of the electrical buss 34 and the distribution of electrical power to the mobile data cabinets 22 within the data center 20 are illustrated in FIGS. 2 and 4. The electrical buss 34 is typically created by four conductors, 84, 86, 88 and 90, which are located within the protective electrically-insulating protective enclosure 62. Three of the conductors 84, 86 and 88 conduct electrical three-phase power, and the fourth conductor 90 is electrical ground. Single phase electrical power could also be conducted by the use of one or two of the conductors 84, 86 or 88. The conductors 84, 86, 88 and 90 are located in channels 92 which extend longitudinally along side walls 94 of the protective enclosure 62. A bottom opening 96 extends longitudinally along the protective enclosure 62. An insert 98 extends upward from the connection module 38 and is inserted into the bottom opening 96 at a location along the length of the protective enclosure 62.

The insert 98 includes electrical contacts 100 which align with the conductors 84, 86, 88 and 90 when inserted fully into the bottom opening 96. The connection module 38 and the attached insert 98 are twisted, thereby moving the electrical contacts 100 into mechanical and electrical contact with the conductors 84, 86, 88 and 90. Twisting the connection module 38 and the insert 98 physically attaches the connection module 38 to the protective enclosure 62 at a desired location within the data center 20 while simultaneously establishing an electrical connection to the conductors 84, 86, 88 and 90. One or more protective enclosures 62 extend throughout the data center, usually on its ceiling, thereby permitting electrical power to be distributed at a relatively close location to the desired location of the mobile data cabinets 22 in the data center 20. Distributing the electrical power eliminates the need for a licensed electrician to install new electrical power receptacles whenever the data processing devices are relocated within the data center 20.

The connection module 38 includes a power connection receptacle 102 and a circuit breaker 104. The power connection receptacle 102 receives the electrical plug 58 attached on the end of the power delivery cable 40. The electrical plug 58 and receptacle 102 establish a beneficial twist-lock type connection to prevent the accidental disconnection of the plug 58 from the receptacle 102. The power delivery cable 40 receives electrical power from the conductors 84, 86, 88 and 90 of the electrical buss 74 and distributes the electrical power through the power distribution unit 52 to the electrical plugs 56 and power cords 54 (FIG. 2) of the data processing devices 26. The circuit breaker 104 protects against delivering excessive current to each individual mobile cabinet 22.

Details of the thermal cooling capability of the data center 20 are described in conjunction with FIG. 1. The cooling source 42 is conventional and typically includes a chiller (not shown) which removes heat from air circulating within the room 24. The chiller delivers cold water or other liquid to a heat exchanger (not shown), and air is forced through the heat exchanger by a fan or blower (also not shown). The cooled air is then distributed through the cooling ducts 44 which extend throughout the room 24, usually in the ceiling. The outlets 46 are connected at selected locations to the cooling ducts 44, to deliver the cool air down on and in the vicinity of the mobile data cabinets 22. Dampers or valves (not shown) may be included as part of the outlets 46 to control the amount of cooled air distributed from those outlets. In those areas of the room 24 where the mobile data cabinets 22 are closely accumulated, more cooling air will be distributed. In those areas of the room 24 with a lesser accumulation of mobile cabinets 22, less cooling air will be distributed. In this matter, the thermal cooling capacity is increased in those areas of the data center 20 where it is most needed and reduced in those areas were less cooling capacity is required. Adjusting the cooling capacity is therefore possible according to the placement of the mobile cabinets 22, or if cooling capacity is limited, the mobile cabinets can be moved to optimize the cooling capacity Advantageously, the thermal cooling within the room 24 does not involve using a raised floor. In many data centers, raised floors are used to obtain thermal cooling capacity. Raised floors are very expensive to construct, and in many cases, the raised floor does not permit adjustment of the cooling capacity, or the adjustment of the cooling capacity is only achieved by reconstructing part of the floor. Moreover, many types of raised floors do not permit adjustment of the positions of the data processing equipment supported by the floor, due to the structural aspects of the raised floor required to support the data processing equipment. Utilizing cooling ducts 44 and the outlets 46 within the ceiling of the room 24 makes use of relatively inexpensive conventional thermal air conditioning techniques typically used in building construction, and therefore minimizes the expense associated with cooling the room 24 to assure proper functionality of the data processing devices 26 within the mobile cabinets 22 in the data center 20.

The significant advantage of mobility of the data cabinet 22, while still obtaining high-capacity data processing, is achieved by moving the mobile cabinet from a previous to a new location within the data center 20, by disconnecting the electrical plug 58 from the connection module 38, and disconnecting the main optical cable 30 at the MPO connector 76, as is understood from FIG. 1. The mobile cabinet 22 is thereafter rolled on the casters 50 to the new location within the data center 20. None of the data processing equipment 26 within the mobile cabinet 22 is disconnected from itself. To the extent that one or more additional mobile housing structures 48 containing only computing devices 64 and terminal servers 66 is associated with the moved mobile cabinet 22, the computing devices 64 and terminal servers 66 in each associated mobile housing structure may be easily disconnected from the data processing devices 26 in the mobile cabinet 22 by the use of the conventional quick connect electrical and optical connectors. The electrical plug which extends to each mobile housing structure is easily disconnected from the electrical buss 34. Once the mobile cabinet 22 is located in the new location and each associated mobile housing structure 48 with computing devices 64 and terminal servers 66 is also moved adjacent to the moved mobile cabinet 22, the electrical and optical communication connections between the computing devices 64 and terminal servers 66 in the mobile housing structure(s) and data processing devices 26 in the mobile cabinet 22 are easily reestablished through the quick connect optical and electrical connectors.

Connection modules 38 are easily connected to the electrical buss 34 at selected locations to accommodate the power requirements of the repositioned mobile cabinet 22 and any associated mobile housing structures 48. The amount of thermal cooling necessary to accommodate the repositioned mobile cabinet 22 and any associated mobile housing structures 48 is easily adjusted by opening and closing the outlets 46 on the cooling ducts 44 to increase the amount of cooling in those areas of the data center 20 which require additional cooling due to an increased accumulation of data processing devices 26, while simultaneously decreasing the amount of cooling and any other areas of the data center 20 where a lesser number of data processing devices 26 are located.

The advantage of mobility are also achieved by consolidating and reducing the number of connections for data communication and electrical power, in a way which does not compromise or restrict the functionality of the data processing devices 26 in each mobile cabinet 22 and any associated mobile housing structures 48. The access switch 70 effectively electrically connects the data processing devices 26 in each mobile cabinet 22 for effective data communication and to establish optical communications for those data processing devices 26 which do not have optical input/output ports. The optical interface and connection device 32 permits optical outgoing and incoming communications to the mobile cabinet 22, thereby achieving a very high data communication rate between the data processing devices 26 of the other mobile cabinets 22 in the data center 20 and to the central communication services 28 through the central service interface 31. The electrical connection through the access switch 70, and the optical connection through the optical device 30, permit the data processing equipment to remain connected within the mobile cabinet when it is moved to different locations.

The mobility of the data cabinets 22 allows them to be moved and grouped to achieve the most beneficial and effective data processing functionality within the data center 20. The reduced and simplified power and data communication connections permit the mobile cabinet 22 to be positioned and connected to quickly achieve full functionality, without the necessity to have the optical cables specifically and individually terminated to provide effective data communications, and without the necessity to have electrical power service specifically routed to the new or repositioned location of the cabinet 22. The power and data communication connections to the mobile cabinet 22 are made with reusable connectors that repeatedly attach to and detach from one another and that do not require tools or specially trained personnel to manipulate. The MPO connectors for the optical cables have a relatively low insertion loss, thereby avoiding the necessity to have each cable specifically and individually terminated. The ease of attaching and detaching the modular data cabinet 22 to the electrical power and data communication sources, combined with the mobility of the mobile cabinet 22, the reduced number of electrical power and data communications connections and the retained connection of the data processing equipment within each mobile cabinet 22 and mobile enclosure, allow the mobile cabinets 22 and mobile housing structures 48 to be relocated in the data center 20 with minimal cost and downtime.

Many other improvements and advantages are either discussed above or will be more apparent upon fully comprehending the significant aspects of the present invention. The presently preferred embodiments of the invention have been described above with a degree of particularity. The description is of preferred examples for implementing the invention, and is not necessarily intended to limit the scope of the invention. The scope of the invention is defined by the following claims.

The invention claimed is:

1. A method of mobilizing multiple data processing devices within a data center where the multiple data processing devices are connected to a shared central interface by which to communicate with each other and with a central communication service, comprising:

dividing the multiple data processing devices into multiple groups with each group having multiple data processing devices;

locating the multiple data processing devices of each group in a separate mobile data cabinet;

including an access switch and a multiplicity of computing devices in the multiple data processing devices in each group in each mobile data cabinet;

connecting the computing devices in each mobile data cabinet to the access switch;

including an optical interface as part of the data processing devices in each mobile data cabinet;

connecting the access switch to each optical interface within each mobile data cabinet;

connecting the optical interface of each mobile data cabinet to the shared central interface with a main optical cable within the data center by mating two complementary optical connectors, one of which is attached to the optical interface of each mobile data cabinet and the other of which is attached to each main optical cable;

communicating data between data processing devices in each mobile data cabinet through the access switch in the mobile data cabinet;

communicating data between the shared central interface and the data processing devices in each mobile data cabinet through the main optical cable connected to each mobile data cabinet and the access switch and optical interface of each mobile data cabinet; and thereafter in the following recited sequence:

disconnecting the complementary optical connector of one main optical cable extending from the shared central interface to one mobile data cabinet from the complementary optical connector of the optical interface of the one mobile data cabinet;

moving the one mobile data cabinet from an initial location within the data center to a subsequent location which is physically displaced from the initial location within the data center; and reconnecting the complementary optical connector of the optical interface of the one mobile data cabinet with a substantially identical complementary optical connector of another main communication cable extending from the shared central interface to the subsequent location within the data center where the one mobile data cabinet is moved.

2. A method as defined in claim 1, wherein the complementary optical connectors of the optical interface and each main optical cable are of the quick-connect and quick-disconnect type.

3. A method as defined in claim 1, further comprising;

using complementary optical connectors on the ends of the main optical cables which universally connect to the complementary optical connectors to the optical interfaces of each mobile data cabinet and which do not require individual termination for connecting the ends of the main optical cables to the optical interfaces of each mobile data cabinet.

4. A method as defined in claim 3, further comprising:

using multi-path push-on type optical connectors as the complementary optical connectors on the ends of the main optical cables and the optical interfaces.

5. A method as defined in claim 4, further comprising:

using complementary optical connectors which limit an insertion loss at each connection between the main optical cables and the optical interfaces to no greater than 0.5 dB.

6. A method as defined in claim 3, further comprising:

using complementary optical connectors which limit an insertion loss at each connection between the main optical cables and the optical interfaces to no greater than 0.5 dB.

7. A method as defined in claim 1, further comprising:

electrically connecting the computing devices within each mobile data cabinet to the access switch within each mobile data cabinet; and optically connecting the access switch within each mobile data cabinet to the optical interface within each mobile data cabinet.

8. A method as defined in claim 7, further comprising:

including a terminal server within the data processing devices in at least one mobile data cabinet in the data center; and electrically connecting the terminal server to the access switch within the one mobile data cabinet.

9. A method as defined in claim 8, further comprising:

optically connecting at least one of the computing devices within at least one mobile data cabinet to the optical interface;

communicating data optically between the optical interface and the one of the computing devices which is optically connected to the optical interface; and communicating data electrically between the access switch and the one of the computing devices which is optically connected to the optical interface.

10. A method as defined in claim 1, further comprising:

connecting each mobile data cabinet to the shared central interface with a single main optical cable.

11. A method as defined in claim 10, further comprising:

including a plurality of optical fibers in the single main optical cable to communicate optical data.

12. A method as defined in claim 1, further comprising:

distributing electrical power over an electrical buss within the data center at positions adjacent to the initial and subsequent locations;

commonly powering the multiple data processing devices in each mobile data cabinet from a single power delivery cable extending from each mobile data cabinet;

electrically connecting the power delivery cable from each mobile data cabinet to the electrical buss by mating two complementary power connectors, one of which is attached to the power delivery cable and the other of which is attached to a connection module attached to the electrical buss at a position adjacent to the initial location; and moving the one mobile data cabinet from the initial location to the subsequent location by disconnecting the complementary power connector attached to the power delivery cable from the complementary power connector attached to the connection module at a position adjacent to the initial location and reconnecting the complementary power connector attached to the power delivery cable with a connection module attached to the electrical buss at a position adjacent to the subsequent location.

13. A method as defined in claim 12, further comprising:

connecting each mobile data cabinet to the electrical buss with a single power delivery cable.

14. A method as defined in claim 12, further comprising:

attaching each connection module to the electrical buss at selected locations; and attaching a connection module to the electrical buss at the subsequent location after having previously removed the connection module from the electrical buss at the initial location.

15. A method as defined in claim 1, further comprising:

selectively increasing a flow of cooling fluid within the data center at the subsequent location to accommodate increased heat at the subsequent location due to moving the mobile data cabinet to the subsequent location.

16. A mobile data cabinet for use in repositioning multiple data processing devices within a data center where the multiple data processing devices are connected to a shared central interface by which to communicate with each other and with a central communication service, the data center including a plurality of main optical cables connected to the shared central interface and extending therefrom to multiple locations within the data center, the mobile data cabinet comprising:

a housing structure for supporting a group of data processing devices;

the group of data processing devices in the housing structure including one access switch and a plurality of computing devices:

the access switch connected to the computing devices within the housing structure to communicate data between the computing devices through the access switch;

an optical interface as part of the data processing devices in the housing structure and wherein:

the access switch is connected to the optical interface within the housing structure;

the mobile data cabinet further includes rollers by which to move the housing structure within the data center from an initial location to a subsequent location which is physically displaced from the initial location within the data center;

the main optical cable is connected to the optical interface in the housing structure by mating two complementary optical connectors one of which is attached to the optical interface and the other of which is attached to each main optical cable, the connection of the complementary connector attached to the optical interface and the complementary connector attached to one of the main optical communication cables permitting data communication between the access switch and the optical interface and the shared central interface; and wherein:

the two complementary optical connectors permit moving the mobile data cabinet from the initial location to the subsequent location by disconnecting the complementary optical connector attached to the main optical cable at the initial location from the complementary optical connector attached to the optical interface and thereafter reconnecting the complementary optical connector attached to a different main optical cable at the subsequent location to the complementary optical connector attached to the optical interface.

17. A mobile data cabinet as defined in claim 16, wherein the complementary optical connectors attached to the optical interface and each main optical cable are of the quick-connect and quick-disconnect type.

18. A mobile data cabinet as defined in claim 16, wherein:

the complementary optical connectors on the ends of the main optical cables universally connect to the complementary optical connector of the optical interface in a manner which does not require individual termination when connecting the end of the main optical cable to the optical interface.

19. A mobile data cabinet as defined in claim 18, wherein: the complementary optical connectors comprise multi-path push-on type optical connectors on the ends of the main optical cables and the optical interface.

20. A mobile data cabinet as defined in claim 18, wherein: the complementary optical connectors limit an insertion loss at each connection between the main optical cable and the optical interface to no greater than 0.5 dB.

21. A mobile data cabinet as defined in claim 16, wherein: the computing devices within the housing structure are electrically connected to the access switch within the housing structure; and the access switch within the housing structure is optically connected to the optical interface within the housing structure.

22. A mobile data cabinet as defined in claim 21, further comprising:

a terminal server included within the data processing devices in the housing structure; and wherein:

the terminal server is electrically connected to the access switch within the housing structure.

23. A mobile data cabinet as defined in claim 22, further comprising:

at least one of the computing devices within the housing structure is optically connected to the optical interface to communicate data optically between the optical interface and the one of the computing devices which is optically connected to the optical interface; and wherein:

data is electrically communicated between the access switch and the one of the computing devices which is optically connected to the optical interface.

24. A mobile data cabinet as defined in claim 16, wherein: the optical interface is connected to the shared central interface with a single main optical cable; and the single main optical cable includes a plurality of optical fibers to communicate the optical data between the shared central interface and the optical interface in the housing structure.

25. A mobile data cabinet as defined in claim 16, wherein the data center further comprises an electrical buss for distributing electrical power within the mobile data cabinet at positions adjacent to the initial and subsequent locations; and the mobile data cabinet further comprises:

a single power delivery cable extending from the housing structure to commonly power the multiple data processing devices in the housing structure from the single power delivery cable; and two complementary power connectors one of which is attached to the power delivery cable and the other of which is attached to a connection module attached to the electrical buss at a position adjacent to the initial location by which to move the mobile data cabinet from the initial location to the subsequent location by disconnecting the complementary power connector attached to the power delivery cable from the complementary power connector attached to the connection module and reconnecting the complementary power connector attached to the power delivery cable with a connection module attached to the electrical buss at a position adjacent to the subsequent location.

26. A mobile data cabinet as defined in claim 25, wherein the electrical buss within the data center permits attaching each connection module to the electrical buss at selected locations.

27. A mobile data cabinet as defined in claim 16, wherein the data center includes ducts for delivering cooling air at the initial and subsequent locations within the data center to cool the data processing devices, and the amount of cooling air may be adjusted at the initial and subsequent locations to accommodate increased heat at the subsequent location due to moving the mobile data cabinet to the subsequent location.

28. A data center which includes a plurality of the mobile data cabinets defined in claim 16.

29. A method for enhancing utilization of data processing devices within a data center, comprising:

housing a plurality of data processing devices within a mobile data cabinet;

supplying power to the plurality of data processing devices by a power distribution unit within the mobile data cabinet, the power distribution unit coupled to a power source of the data center;

using an access switch within the mobile data cabinet for communicating data between the plurality of data processing devices within the mobile data cabinet and for communicating data between the plurality of data processing devices within the mobile data cabinet and a shared central interface of the data center;

including an optical interface as part of the data processing equipment in the mobile data cabinet;

connecting the access switch to the optical interface within the mobile data cabinet;

connecting one of a plurality of main optical cables between the optical interface and the shared central interface of the data center by mating two complementary optical connectors, one complementary optical connector attached to the optical interface and the other complementary optical connector attached as a part of each main optical cable;

communicating data between the shared central interface and the data processing devices in the mobile data cabinet through the main optical cable, the optical interface and the access switch; and repositioning the mobile data cabinet from an initial location within the data center to a subsequent different location within the data center by disconnecting a connection between the power distribution unit and the power source and by disconnecting the complementary optical connectors when the mobile data cabinet is located at the initial location and thereafter by reconnecting a connection between the power distribution unit and the power source and by connecting the complementary optical connector attached to the optical interface with the complementary optical connector of a different one of the plurality of main optical cables when the mobile data cabinet is located at the subsequent location, without disturbing the connections of the plurality of data processing devices to the access switch and to the power distribution unit in the mobile cabinet.

30. The method of claim 29, wherein the access switch operatively converts electrical signals into optical signals intended for the optical interface and converts optical signals into electrical signals intended for the plurality of data processing devices within the mobile data cabinet.

31. The method of claim 29, further comprising repositioning the mobile data cabinet in the data center to optimize cooling capacity of the mobile data cabinet.

32. A system comprising:

a mobile data cabinet of a data center, the mobile data cabinet housing a plurality of data processing devices;

a power connection between a power distribution unit of the mobile cabinet and a power source of the data center, the power distribution unit supplying power to the plurality of data processing devices within the mobile data cabinet;

an access switch within the mobile data cabinet and connected to each of the plurality of data processing devices, the access switch communicating data between the plurality of data processing devices within the mobile data cabinet;

an optical interface connected to the access switch within the mobile data cabinet;

a optical connection between the optical interface and a shared central interface of the data center, the access switch and the optical interface of the mobile data cabinet operative to communicate data between the plurality of data processing devices and the shared central interface over the optical connection;

two complementary optical connectors within the optical connection, one complementary optical connector attached to the optical interface and the other complementary optical connector attached as a part of the optical connection, the two complementary optical connectors mating together to complete the optical connection; and wherein utilization of the plurality of data processing devices within the data center is enhanced by repositioning the mobile data cabinet from an initial location within the data center to a subsequent location within the data center, the repositioning including disconnecting the power connection and the two complementary optical connectors when the mobile data cabinet is in the initial position and reestablishing the power connection and connecting the complementary optical connector attached to the optical interface with the complementary optical connector of a different one said optical connection when the mobile data cabinet is located at the subsequent location, without disturbing the connections of the plurality of data processing devices in the mobile cabinet.

* * * * *